US008633270B2

(12) United States Patent
Lochtman et al.

(10) Patent No.: US 8,633,270 B2
(45) Date of Patent: Jan. 21, 2014

(54) DISPERSION FOR APPLYING A METAL LAYER

(75) Inventors: Rene Lochtman, Mannheim (DE); Norbert Wagner, Mutterstadt (DE); Jürgen Kaczun, Wachenheim (DE); Jürgen Pfister, Speyer (DE)

(73) Assignee: BASF SE (DE)

( * ) Notice: Subject to any disclaimer, the term of this patent is extended or adjusted under 35 U.S.C. 154(b) by 456 days.

(21) Appl. No.: 12/996,940

(22) PCT Filed: Jun. 8, 2009

(86) PCT No.: PCT/EP2009/057004
§ 371 (c)(1),
(2), (4) Date: Dec. 8, 2010

(87) PCT Pub. No.: WO2009/150116
PCT Pub. Date: Dec. 17, 2009

(65) Prior Publication Data
US 2011/0086231 A1 Apr. 14, 2011

(30) Foreign Application Priority Data
Jun. 9, 2008 (EP) .................................... 08157846

(51) Int. Cl.
*C08K 3/08* (2006.01)
*C08G 18/08* (2006.01)

(52) U.S. Cl.
USPC ........... 524/439; 524/407; 524/408; 524/413; 524/434; 524/435; 524/436; 524/440; 524/507

(58) Field of Classification Search
USPC ......... 524/407, 408, 413, 434, 435, 436, 439, 524/440, 507
See application file for complete search history.

(56) References Cited

U.S. PATENT DOCUMENTS

| | | | |
|---|---|---|---|
| 2,686,172 A | 8/1954 | Wolf | |
| 3,036,029 A | 5/1962 | Chapin | |
| 3,576,662 A | 4/1971 | Diebold et al. | |
| 4,983,311 A | 1/1991 | Nakamura et al. | |
| 5,064,730 A | 11/1991 | Takano et al. | |
| 5,510,187 A * | 4/1996 | Kumar et al. | 428/425.9 |
| 5,854,175 A | 12/1998 | DeBoer et al. | |
| 6,139,982 A * | 10/2000 | Bottomley et al. | 428/844.8 |
| 2003/0156178 A1 | 8/2003 | Lehmann | |
| 2005/0212888 A1 | 9/2005 | Lehmann et al. | |
| 2008/0169122 A1 | 7/2008 | Shiraishi et al. | |
| 2008/0206553 A1 | 8/2008 | Schneider et al. | |

FOREIGN PATENT DOCUMENTS

| | | |
|---|---|---|
| DD | 135620 | 5/1979 |
| DE | 1521152 A1 | 4/1969 |
| DE | 1615786 A1 | 5/1970 |
| DE | 3935716 A1 | 5/1990 |
| DE | 4004927 A1 | 8/1990 |
| DE | 199 45 400 A1 | 4/2001 |
| DE | 10051850 | 10/2001 |
| DE | 102005043242 | 3/2007 |
| EP | 0 200 772 A1 | 11/1986 |
| EP | 1860163 A1 | 11/2007 |
| WO | WO-86/02882 | 5/1986 |
| WO | WO-96/04135 | 2/1996 |
| WO | WO-01/72518 A1 | 10/2001 |
| WO | WO-03/074278 A1 | 9/2003 |
| WO | WO-2005/001850 A2 | 1/2005 |
| WO | WO-2007/028762 A2 | 3/2007 |
| WO | WO-2009035453 A1 | 3/2009 |

OTHER PUBLICATIONS

LeMaster et al., "Nmr Analysis of Polyester Urethane End Groups and Solid-Phase Hydrolysis Kinetics," Macromolecules, vol. 33, No. 10, May 1, 2000, pp. 3569-3576.
Salazar et al., "Degradation of a Poly(ester urethane) Elastomer. Iii. Estane 5703 Hydrolysis: Experiments and Modeling," Journal of Polymer Science, Part a: Polymer Chemistry, vol. 41, No. 8, Apr. 15, 2003, pp. 1136-1151.
English language translation of the International Preliminary Report on Patentability issued in related International Application No. PCT/EP2009/057004, published Mar. 8, 2011.

* cited by examiner

*Primary Examiner* — Peter D Mulcahy
(74) *Attorney, Agent, or Firm* — Novak Druce Connolly Bove + Quigg LLP

(57) ABSTRACT

The present invention relates to a dispersion for the application of a metal layer on a non-electrically-conductive substrate comprising an organic binder component, a metal component, and also a solvent component. The invention further relates to processes for the production of the dispersion, processes for the production of a non-structured or structured metal layer with the aid of the dispersion, and also to the resultant substrate surfaces and their use.

11 Claims, No Drawings

US 8,633,270 B2

DISPERSION FOR APPLYING A METAL LAYER

CROSS REFERENCE TO RELATED APPLICATIONS

This application is a national stage application under 35 U.S.C. §371 of PCT/EP2009/057004, filed Jun. 8, 2009, which claims benefit to European application 08157846.0, filed Jun. 9, 2008, the entire disclosures of which are hereby incorporated by reference.

The present invention relates to a dispersion for the application of a metal layer, to processes for its production, and also to processes for the production of a metal layer on a substrate with the aid of the dispersion. The dispersion further relates to substrate surfaces thus coated, and also to their use.

There are various known techniques for the production of electrically conductive metallic layers on substrates which do not conduct electrical current. By way of example, non-electrically-conducting substrates, such as plastics, can be subjected to high-vacuum metallization, but these processes are complicated and expensive.

The usual method of metallizing plastics carries out a number of successive process steps. This process begins with a surface activation step using strong acids or bases, an example being chromosulfuric acid. The plastic surface is then coated by using solutions of suitable transition metal complexes. These permit metallization of the activated plastics surface in the process.

However, it is also possible to use conductive lacquers or conductive pastes to obtain conductive coatings on non-electrically-conductive surfaces, these being applied to the plastic, but for this process they have to have good adhesion to the material.

DE-A 1 615 786 describes by way of example processes for the production of electrically conducting layers on non-electrically-conducting surfaces with the aid of a lacquer layer comprising finely dispersed iron. The lacquer is moreover intended to comprise an organic solvent, and also certain proportions of binder.

However, it is known that these conductive lacquers have only relatively low conduction values, since the binder prevents the dispersed metallic particles from forming a coherent conducting layer. The conduction values of these layers do not therefore achieve those of metal foils of comparable thickness. Although an increase in the proportion of metal pigment within the layer would also lead to an increase in the conduction values, problems frequently arise here, attributable to inadequate adhesion of the conducting layer on the plastics surface.

DE-A 1 521 152 therefore proposes applying, to the non-electrically-conducting surface, a conductive lacquer which comprises a binder and also comprises finely dispersed iron, and then using a currentless method to apply a layer of silver or of copper to the conductive lacquer. A further layer can then be applied by a currentless or electroplating method.

EP-B 200 772 describes the coating of a non-electrically-conducting article with the aid of a fluid organic paint binder, in order to achieve electromagnetic shielding at a frequency above 10 kHz. This process begins by applying a primary layer with the fluid organic paint binder, in which active metal particles have been dispersed, and then a second layer of copper is deposited on the primary layer by a currentless method, and finally a third layer composed of an electroplatinized metal is applied to the second layer.

DE-A 199 45 400 describes inter alia a magnetic dispersion which is intended to comprise a specific binder and a magnetic or magnetizable material.

DE-A-10 2005 043 242 A1 relates to a dispersion for the application of a metal layer on a non-conductive substrate, comprising an organic binder component, a metal component with various metals and/or metal particles, and also a solvent component.

With a view to increasingly stringent requirements, there is moreover a need to optimize the systems for the metallic coating of non-electrically-conducting substrates, in particular to improve adhesion, in order to ensure adequate functionality in the subsequent steps of processing and in use.

It is therefore an object of the present invention to provide a dispersion which permits the application of a metal layer on a non-electrically-conducting substrate, and in particular can achieve increased adhesion and/or layer homogeneity of the metal layer here.

The present invention provides a dispersion for the application of a metal layer on a non-electrically-conductive substrate comprising
an organic binder component A
a metal component B
a solvent component C,
wherein the organic binder component A consists essentially of
A1 a polyvinyl chloride copolymer having hydroxy groups and
A2 a polyurethane having hydroxy groups.

One preferred embodiment is one wherein component A1 is obtainable by polymerization of vinyl chloride with at least one hydroxyacrylate or vinyl acetate and subsequent at least partial hydrolysis, and wherein A2 is a linear polyurethane containing hydroxy groups. In one embodiment, component A1 comprises repeat vinyl acetate units and repeat vinyl alcohol units. In another embodiment, A1 comprises acrylate units and vinyl alcohol units.

Another preferred embodiment is one wherein components A1 and A2 make up at least 80% by weight of binder component A.

Another preferred embodiment is one wherein for each part by weight of A2 there are from about 0.25 to 4 parts by weight, in particular from 1 to 2 parts by weight, of component A1.

Another preferred embodiment is one wherein the dispersion comprises from 0.01 to 30% by weight of the organic binder component A, from 30 to 89.99% by weight of the metal component B, from 10 to 69.99% by weight of the solvent component C, based in each case on the total weight of the dispersion.

Another preferred embodiment is one wherein component B comprises
B1 from 0.01 to 99.99% by weight, based on the total weight of metal component B, of a first metal with a first metal particle shape, and
B2 from 99.99 to 0.01% by weight, based on the total weight of metal component B, of a second metal with a second metal particle shape,
where, one particularly preferred embodiment complies with at least one of the following conditions:
(1) the first and second metal are different
(2) the first and second particle shape are different.

The dispersion can moreover comprise at least one of the following components:
D) from 0.01 to 50% by weight, based on the total weight of the dispersion, of a dispersing agent component; and also E) from 0.01 to 50% by weight, based on the total weight of the dispersion, of a filler component.

Component A

Binder component A in essence comprises the polyvinyl chloride A1 and the polyurethane A2. In one preferred embodiment, components A1 and A2 make up from 80 to 100% of binder component A.

Component A1

Examples of preferred polyvinyl chlorides containing hydroxy groups are the Vinnol® E grades marketed by Wacker Polymer Systems GmbH Burghausen, Germany, these being produced by emulsion polymerization. Examples of suitable components A1 are vinyl chloride copolymers composed of vinyl chloride and of hydroxy-functional comonomers, e.g. allyl alcohol; of hydroxyacrylates, in particular 2-hydroxyethyl(meth)acrylate, 2-hydroxypropyl(meth)acrylate, hydroxybutyl(meth)acrylate; of allyl esters of hydroxycarboxylic acids, in particular allyl hydroxycaproate. In one preferred embodiment, A1 comprises from 1 to 50% by weight, in particular from 5 to 30% by weight, of the copolymerized hydroxy-functional comonomers.

Other suitable materials are vinyl chloride copolymers composed of vinyl chloride and of vinyl acetate, which after the polymerization reaction are at least to some extent hydrolyzed to form repeat vinyl alcohol units, e.g. the UCAR™ grades marketed by DOW Chemical Company. In one preferred embodiment, A1 comprises from 1 to 25% by weight, in particular from 3 to 15% by weight, of the repeat vinyl alcohol units.

The molar mass $M_w$ of particularly preferred components A1 is from 20 000 to 200 000 g/mol. Suitable components A1 are described by way of example in DD135620, page 3 to 6; U.S. Pat. No. 3,036,029, column 1 to 3; U.S. Pat. No. 2,686,172, column 1 to 6 and WO 96/04135, pages 8 to 18.

Polyurethane Component A2

Particularly suitable components A2 are polyurethanes having hydroxy groups and having a molecular weight Mw of from 1000 to 300 000, preferably from 5000 to 300 000 (measured by GPC), produced from diisocyanates and from a) polyesters having a hydroxyl group and having a molecular weight Mw of from 500 to 10 000, composed of alkanedicarboxylic acids and of alkanediols, or
b) polyesters having a molecular weight Mw of from 500 to 10 000, obtained by polycondensation of hydroxyalkanemonocarboxylic acids or by polymerization of their lactones, or
c) polyethers having hydroxy groups and having the formula (I)

$$\text{HO—(R—X)}_n\text{—H} \quad\quad (I),$$

in which:
R is $C_1$-$C_{10}$-alkylene, $C_3$-$C_{10}$-cycloalkylene, or $C_5$-$C_{14}$-arylene, preferably phenylene,
X is oxygen (O) and/or sulfur (S), and
n is a whole number from 10 to 100.
The number n in formula (I) is preferably selected in such a way that the molecular weight Mw of the polyether is from 500 to 10 000.
Examples of these polyethers are polyethylene oxide, polypropylene oxide, polybutylene oxide, polyhexamethylene glycol, etc.

Preference is given to polyurethanes composed of polyesters which have hydroxy groups and which derive from alkanedicarboxylic acids having at least six carbon atoms and from alkanediols having at least four carbon atoms. Examples of suitable alkanedicarboxylic acids are adipic acid, pimelic acid, suberic acid, azelaic acid, sebacic acid, etc. Examples of suitable alkanediols are ethylene glycol, 1,4-butanediol, 1,5-pentanediol, 1,6-hexanediol, etc.

Particular preference is given to polyester polyurethanes produced by reaction of aa) polyesterdiols whose molecular weight is above 600 and, if appropriate,
ab) diols whose molecular weight ranges from 62 to 600, as chain extenders, with
ac) organic diisocyanates, while maintaining a ratio of equivalents of hydroxy groups of components aa) and ab) to isocyanate groups of component ac) of from 1:0.9 to 1:0.999, wherein component aa) is composed of at least 80% by weight of polyesterdiols whose molecular weight ranges from 4000 to 6000, based on (i) adipic acid and on (ii) a mixture composed of 1,4-dihydroxybutane and 1,6-dihydroxyhexane, where the molar ratio of the diols is from 4:1 to 1:4.

Component aa) is preferably composed of at least 80% by weight of polyesterdiols whose molecular weight, which can be calculated from the hydroxy number, is from 4000 to 6000, based on (i) adipic acid and (ii) a mixture composed of 1,4-dihydroxybutane and 1,6-dihydroxyhexane, where the molar ratio of the diols is from 4:1 to 1:4, preferably from 7:3 to 1:2. These polyesterdiols are produced in a manner known per se via reaction of adipic acid with an excess of the diol mixture corresponding to the molecular weight mentioned, at from 100 to 220° C., until the acid number of the reaction mixture has fallen below 2.

Component aa) can comprise, alongside these polyesterdiols, up to 20% by weight of other polyesterdiols whose molecular weight, which can be calculated from the hydroxy number, is above 600. The molecular weight of these polyesterdiols to be used concomitantly, if appropriate, is generally from 1000 to 4000. These polyesterdiols are those obtainable in a known manner by reaction of alkanedicarboxylic acid preferably having at least 6 carbon atoms and alkanediols preferably having at least 4 carbon atoms. Examples of suitable diols are 1,4-dihydroxybutane, 1,5-dihydroxypentane, or 1,6-dihydroxyhexane.

The production of the polyesterester polyurethanes can, if appropriate, make concomitant use, as structural component ab), of the low-molecular-weight chain extenders known per se, having two terminal hydroxy groups. These are generally dihydric alcohols whose molecular weight ranges from 62 to 600, preferably from 62 to 118.

These chain extenders are preferably alkanediols having terminal hydroxy groups and having from 2 to 3, preferably from 2 to 6, and in particular from 4 to 6 carbon atoms, e.g. 1,2-dihydroxyethane, 1,3-dihydroxypropane, 1,4-dihydroxybutane, 1,5-dihydroxy-pentane, 1,6-dihydroxyhexane, or any desired mixture of these diols.

The amount of component ab) used concomitantly, if it is used at all, is up to 200 hydroxy-equivalent percent, preferably up to 100, and preferably up to 70, based on component aa). Particularly if mixtures of alkanediols of the type mentioned are used as component ab), the total amount of the chain extenders used concomitantly can be from 100 to 200 hydroxy-equivalent percent, based on component aa). If only one chain extender of the type mentioned by way of example is used, the amount of component ab) is generally at most 100 hydroxy-equivalent percent, based on component aa). Particularly preferred is the use of component ab) in an amount being from 30 to 70 hydroxy-equivalent percent, based on component aa).

Production of the hydroxypolyurethane component (A) to be used in the invention uses aliphatic, cycloaliphatic, araliphatic, and aromatic diisocyanates of any desired type, particularly those of the formula

in which
Q is an aliphatic hydrocarbon moiety particularly having from 4 to 10, preferably 6, carbon atoms, a cycloaliphatic hydrocarbon moiety particularly having from 5 to 15 carbon atoms, preferably from 6 to 13 carbon atoms, an aromatic hydrocarbon moiety particularly having from 6 to 15 carbon atoms, preferably from 7 to 13 carbon atoms, or an araliphatic hydrocarbon moiety particularly having from 1 to 13 carbon atoms.

Examples of preferred diisocyanates are butane 1,4-diisocyanate, hexane 1,6-diisocyanate, cyclohexylene 1,4-diisocyanate, 1-methyl-2,4-diisocyanato-cyclohexane, 1-methyl-2,6-diisocyanatocyclohexane, 2,4- or 2,6-diisocyanatotoluene, and also mixtures of these, diphenylmethane 4,4'-diisocyanate, etc.

The reaction of the diisocyanates with the hydroxypolyesters and with the corresponding ethers a)-c) preferably takes place in a manner known per se by heating the components together at temperatures of from 70 to 160° C.

Examples of suitable materials are the Desmocoll® grades from Bayer AG/Bayer Material Science AG, Leverkusen, in particular grades 140, 500, and 530.

Further Constituents of Binder Component A

Binder component A can also comprise further binders, for example natural and synthetic polymers and their derivatives, natural resins, and also synthetic resins and their derivatives, natural rubber, synthetic rubber, proteins, cellulose derivatives, e.g. cellulose nitrate, alkylcelluloses, cellulose esters, drying and non-drying oils and the like, in particular polyalkylenes, polyimides, epoxy resins and phenolic resins, styrene-butadiene block copolymers, styrene-isoprene block copolymers, alkylene-vinyl acetates and copolymers, copolymers composed of vinyl chloride and of vinyl ethers, polyamides, and also copolymers of these, poly(meth)acrylates, or polyvinyl ethers, polyvinyl acetals and copolymers of these.

Based on the total weight of the dispersion, the proportion of organic binder component A), is in particular from 0.01 to 30% by weight; the proportion is preferably from 0.1 to 20% by weight, more preferably from 0.5 to 10% by weight.

Component B

The metal component B preferably comprises a first metal with a first metal particle shape and a second metal with a second metal particle shape.

The first metal can be a metal identical with or different from the second metal. The first metal particle shape can likewise be identical with or different from the second metal particle shape. However, it is preferable that at least the metals or the particle shapes are different. However, it is also possible that not only the first and the second metal but also the first and second particle shape differ from one another.

The dispersion can comprise, alongside metal components B1 and B2, further metals different from the first and second metal, different from the first or second metal, or identical with the first and second metal. An analogous statement applies to the metal particle shape of a further metal. For the purposes of the present invention, however, it is preferable that at least one first and second metal, and also one first metal particle shape and one second metal particle shape is/are present satisfying the condition that the first and second metal are different and/or that the first and second particle shape are different from one another.

For the purposes of the present invention, the oxidation state of the metals is 0 and they can be introduced in the form of metal powder into the dispersion.

The average particle diameter of the metals is preferably from 0.001 to 100 µm, with preference from 0.002 to 50 µm, and with particular preference from 0.005 to 10 µm. The average particle diameter can be determined by laser scattering measurement, for example on Microtrac X100 equipment. The distribution of the particle diameters depends on the production processes used for these. The distribution of diameters typically has only one maximum, but there can also be a plurality of maxima.

It is therefore possible, for example, to mix particles whose average diameter is <100 nm with particles >1 µm, with the aim of achieving denser packing of particles.

Examples of suitable metals are zinc, nickel, copper, tin, cobalt, manganese, iron, magnesium, lead, chromium, bismuth, silver, gold, aluminum, titanium, palladium, platinum, tantalum, and also alloys of these. Examples of suitable alloys are CuZn, CuSn, CuNi, SnPb, SnBi, SnCo, NiPb, ZnFe, ZnNi, ZnCo, and ZnMn. Particular preference is given to iron, zinc, aluminum, copper, and silver.

The metal can also comprise non-metallic content alongside the metallic content. At least part of the surface of the metal can therefore have a coating. Suitable coatings can be of inorganic (e.g. $SiO_2$, phosphates) or organic type. The metal can, of course, also have a coating of a further metal or metal oxide. The metal can likewise be present to some extent in oxidized form.

If the intention is that two different metals form metal component B, this result can be achieved by mixing of two metals. It is particularly preferable that the two metals have been selected from the group consisting of iron, zinc, aluminum, copper, and silver.

However, metal component B can also comprise a first metal and a second metal where the second metal is present in the form of an alloy (with the first metal or with one or more of the metals), or metal component B can comprise two different alloys. In these two instances, the respective metal components B1 and B2 are again different from one another, and their metal particle shape can therefore be selected independently of one another to be identical or different.

Alongside the selection of the metals, the metal particle shape of the metals has an influence on the properties of the dispersion of the invention, after coating. With respect to the shape, there are numerous possible variants known to the person skilled in the art. By way of example, the shape of the metal particle can be acicular, cylindrical, lamellar, or spherical. These particle shapes are idealized shapes, and the actual shape can, for example as a result of the production process, differ to a lesser or greater extent from these. By way of example, therefore, droplet-shaped particles are for the purposes of the present invention a practical deviation from the idealized spherical shape.

Metals with various particle shapes are commercially available.

If metal components B1 and B2 differ in their particle shape, it is preferable that the first is spherical and the second is lamellar or acicular.

If particle shapes are different, preferred metals are likewise iron, copper, zinc, aluminum, and silver.

As stated above, the metals can be added in the form of their powders into the dispersion. Metal powders of this type are familiar commercially available products, or can readily be produced by known processes, for example by electrolytic deposition or chemical reduction from solutions of the metal salts, or by reduction of an oxidic powder, for example using hydrogen, or by spraying or atomization of a molten metal, in particular into coolants, such as gases or water. Gas atomization and water atomization are preferred.

In the case of iron, preference is given not only to gas atomization and water atomization but also to the carbonyl iron powder process (CEP process) for the production of carbonyl iron powder. This uses thermal decomposition of pentacarbonyl iron. The process is described by way of example in Ullman's Encyclopedia of Industrial Chemistry, 5th Edition, vol. A14, page 599. The decomposition of the pentacarbonyl iron can by way of example take place at elevated temperatures and elevated pressures in a heatable decomposition reactor which comprises a tube composed of a heat-resistant material, such as quartz glass or V2A steel, preferably in a vertical position, surrounded by heating equipment, for example composed of heating baths, or heating wires, or of the heating jacket through which a hot fluid flows.

Lamellar metals can be obtained by optimizing conditions in the production process, or downstream by mechanical treatment, for example by treatment in a stirred ball mill.

The proportion of metal component B is from 30 to 89.99% by weight, based on the total weight of the dispersion. The proportion of metal subcomponent B1 is from 99.99 to 0.01% by weight, based on the total weight of component B. The proportion of metal subcomponent B2 is from 0.01 to 99.99% by weight. If no further metals are present, B1 and B2 give 100% of metal component B.

A preferred range of B is from 50 to 85% by weight, based on the total weight of the dispersion.

The ratio by weight of components B1 and B2 is preferably in the range from 1000:1 to 1:1, more preferably from 100:1 to 1:1, most preferably in the range from 20:1 to 1:1.

Component C

The dispersion of the invention moreover comprises a solvent component C. This consists essentially of a solvent or of a solvent mixture.

Suitable solvents are acetone, alkyl acetate, butyl diglycol, alkyl glycol acetates, such as butyl glycol acetate, butyl glycol, benzyl acetate, butyl acetate, gamma-butyrolactone, benzyl alcohol, chloroform, cyclohexanone, diacetone alcohol, diglycol dimethyl ether, dioxane, ethyl acetate, ethylene chloride, ethylene glycol acetate, ethyl glycol, ethoxypropyl acetate, ethylene glycol dimethyl ether, isophorone, isobutyl acetate, isopropyl acetate, methyl acetate, methyl glycol, methylene chloride, methylene glycol, methyl ethyl ketone (MEK), methyl isobutyl ketone (MIBK), methyl glycol acetate, propyl acetate, propylene glycol monoalkyl ethers, e.g. methoxypropyl acetate, carbon tetrachloride, tetrahydrofuran, and also mixtures composed of two or more of these solvents.

Preferred solvents are acetone, alkyl acetates, alkyl glycol acetates, such as butyl glycol acetate, gamma-butyrolactone, benzyl alcohol, benzyl acetate, cyclohexanone, diacetone alcohol, dioxane, ethyl acetate, ethylene glycol acetate, ethoxypropyl acetate, isopropyl acetate, methyl ethyl ketone (MEK), methyl isobutyl ketone (MIBK), methyl glycol acetate, propyl acetate, propylene glycol monoalkyl ethers, e.g. methoxypropyl acetate, tetrahydrofuran, and also mixtures of these.

The proportion of solvent component C, based on the total weight of the dispersion, is from 10 to 69.99% by weight. The proportion is preferably from 15 to 50% by weight.

Component D

The dispersion can moreover comprise a dispersing agent component. This is composed of one or more dispersing agents.

In principle, any of the dispersing agents known to the person skilled in the art for use in dispersions and described in the prior art is suitable. Preferred dispersing agents are surfactants or surfactant mixtures, examples being anionic, cationic, amphoteric, or nonionic surfactants.

Cationic and anionic surfactants are described by way of example in: "Encyclopedia of polymer Science and Technology", J. Wiley & Sons (1966), volume 5, pages 816 to 818, and in "Emulsion polymerisation and Emulsion polymers", editors P. Lovell and M. El-Asser, published by Wiley & Sons (1997), pages 224-226.

Fatty acids are also suitable as dispersing agent component, examples being oleic acid or stearic acid.

However, the dispersing agents used can also comprise polymers known to the person skilled in the art which have anchor groups, where these groups have pigment affinity.

The amount used of dispersing agent component D, based on the total weight of the dispersion, can be in the range from 0.01 to 50% by weight. The proportion is preferably from 0.1 to 25% by weight, particularly preferably from 0.3 to 10% by weight.

Component E

The dispersion of the invention can moreover comprise a filler component E. This can be composed of one or more fillers. Component E of the metallizable composition can therefore comprise fibrous or particulate fillers, or a mixture of these. The materials here are preferably commercially available products, examples being forms of carbon, e.g. carbon blacks, graphenes, carbon nanotubes, and glass fibers.

Other fillers or reinforcing materials that can be used are glass powder, mineral fibers, whiskers, aluminum oxide, mica, powdered quartz, or wollastonite. Other materials that can be used are carbon, silica, silicates, e.g. aerosils or phyllosilicates, dyes, fatty acids, fatty amides, plasticizers, wetting agents, desiccants, catalysts, complexing agents, calcium carbonate, barium sulfate, waxes, pigments, coupling agents, or conductive polymer particles.

The proportion of component E, based on the total weight of the dispersion, is preferably from 0.01 to 50% by weight. Further preference is given to amounts of from 0.1 to 10% by weight, and particular preference is given to amounts of from 0.3 to 5% by weight.

Processing aids and stabilizers can moreover be present in the dispersion of the invention, examples being UV stabilizers, lubricants, corrosion inhibitors, and flame retardants. The proportion of these, based on the total weight of the dispersion, is usually from 0.01 to 5% by weight. The proportion is preferably from 0.05 to 3% by weight.

The present invention also provides a process for the production of the dispersion of the invention by A mixing of components A to C and also, if appropriate, D, E, and of further components, and B dispersion of the mixture.

The dispersion can be produced by intensive mixing and dispersion, using assemblies known to persons skilled in the art. This includes mixing of the components in a dissolver or in a comparable assembly providing intensive dispersion, or dispersion in a stirred ball mill or in a powder fluidizer for large quantities.

The present invention further provides a process for the production of a metal layer on at least one portion of the surface of a non-electrically-conductive substrate by a) application to the substrate of a dispersion of the invention:

b) drying of the applied layer on the substrate; and c) if appropriate, deposition of a metal by a currentless and/or electroplating method on the dried dispersion layer.

Suitable substrates are non-electrically-conductive materials, such as polymers. Suitable polymers are epoxy resins, such as bifunctional or polyfunctional, aramid-reinforced or glassfiber-reinforced, or paper-reinforced epoxy resins (e.g. FR4), glassfiber-reinforced plastics, polyphenylene sulfides (PPS), polyoxymethylenes (POM), polyaryl ether ketones (PAEK), polyether ether ketones (PEEK), polyamides (PA), polycarbonates (PC), polybutylene terephthalates (PBT), polyethylene terephthalates (PET), polyethylene naphthenates (PEN), polyimides (PI), phenolic-resin-coated-aramid-paper dielectrics, APPE, polyetherimides (PEI), polyphenylene oxides (PPO), polypropylenes (PP), polyethylenes (PE), polysulfones (PSU), polyether sulfones (PES), polyarylamides (PAA), polyvinyl chlorides (PVC), polystyrenes (PS), acrylonitrile-butadiene-styrenes (ABS), acrylonitrile-styrene-acrylates (ASA), styrene-acrylonitriles (SAN), and also mixtures (blends) of two or more of the above-mentioned polymers, which can take a very wide variety of forms. The substrates can comprise additives known to the person skilled in the art, e.g. lubricants, stabilizers, or flame retardants.

Particularly preferred substrates are polyethylene terephthalate (PET), polyethylene naphthenate (PEN), polyamide (PA), polycarbonate (PC), polyvinyl chloride (PVC).

Other suitable substrates are composite materials, foam-like polymers, Styropor®, Styrodur®, ceramic surfaces, textiles, paper board, paper, polymer-coated paper, wood, mineral materials, glass.

For the purposes of the present invention, the term "non-electrically-conductive" preferably means that resistivity is more than $10^9$ ohm×cm.

The dispersion can be applied by methods known to the person skilled in the art. Application to the substrate surface can take place on one or more sides and can extend over one, two or three dimensions. The substrate can generally have any desired geometry appropriate to the intended use.

Conventional methods are likewise used for the drying of the applied layer. As an alternative, the binder can also be hardened chemically or physically, for example by using heat.

The layer obtained after application of the dispersion and drying then permits deposition of a metal on the dried dispersion layer by a currentless and/or electroplating method.

The dispersion of the invention can be applied in step a) in structured or non-structured form. It is preferable that the steps of application (step a), of drying (step b) and, if appropriate, the deposition of a further metal (step c) are carried out continuously. The simplicity of steps a), b), and, if appropriate, c) permits this. However, it is, of course, also possible to use a batch process or semicontinuous process.

The coating process can use the usual well known coating methods (casting, spreading, doctoring, brushing, printing (intaglio print, screenprint, flexographic print, pad print, inkjet, offset, etc.), spraying, dip-coating, powdering, fluidized bed, etc.). The layer thickness preferably varies from 0.01 to 100 µm, more preferably from 0.1 to 50 µm, particularly preferably from 1 to 25 µm. Either non-structured or structured layers can be applied.

In one particularly preferred embodiment, the dispersion of the invention is applied to the substrate by a printing process in which the dispersion undergoes a change of volume and/or of position with the aid of a device which dissipates energy in the form of electromagnetic waves, the result being that the dispersion is transferred to the substrate. Processes of this type are known by way of example from WO 03/074278 A1, WO 01/72518 A1, and DE-A-100 51 850. This type of process is supplied by Aurentum Innovationstechnologien GmbH as LaserSonic® Technology.

The deposition of a metal carried out in step c) by a currentless and/or electroplating method can use the process known to the person skilled in the art and described in the literature. One or more metal layers can be applied by a current method and/or by an electroplating method, i.e. by applying an external voltage and using current. Metals that can be used for deposition by the currentless and/or electroplating method are in principle any of those nobler than or as noble as the least noble metal of the dispersion. Preference is given to deposition of copper layers, chromium layers, silver layers, gold layers, and/or nickel layers by an electroplating method. Preference is also given to deposition of layers composed of aluminum by an electroplating method. The thickness of the one or more layers deposited in step c) is within the usual range known to the person skilled in the art and is not of substantial importance for the invention.

In one preferred embodiment of the invention, the substrate is treated with a primer prior to application of the dispersion of the invention. In one preferred embodiment, the primer corresponds to the dispersion of the invention, but with the proviso that it does not comprise metal component B. In one embodiment, therefore, the primer in essence comprises an organic binder component A, a solvent component C, if appropriate a dispersing agent component D, and, if appropriate, a filler component E. In another preferred embodiment, filler component E comprises fillers which can act as spacers, and which can thus prevent blocking when the coated substrate is wound up.

The present invention further provides a substrate with a surface which has, at least in part, an electrically conductive metal layer obtainable by the process described above of the invention for the production of a metal layer.

This type of substrate surface can be used to conduct electrical current or heat, or for shielding from electromagnetic radiation, or else for magnetization.

The present invention further provides the use of a dispersion of the invention for the application of a metal layer.

The substrate of the invention can in particular be used for various applications listed below.

By way of example, it is possible to produce conductor-track structures, for example for the production of antennas, such as RFID antennas or transponder antennas, printed circuit boards (multilayer internal and external sublayers, microvias, chip-on-board, flexible and rigid printed circuit boards, paper and composites, etc.), ribbon cables, seat-heating systems, contactless chip cards, capacitors, resistances, connectors, foil conductors, electrical fuses.

It is also possible to produce antennas with contacts for organic electronic components, and also to produce coatings on surfaces composed of non-electrically-conductive material, for electromagnetic shielding.

It is also possible to produce a non-structured or structured electrically conductive layer for subsequent decorative metallization of moldings, composed of the above-mentioned non-electrically-conductive substrate.

The breadth of application of the process of the invention for the production of a metal layer with the aid of the dispersion of the invention, and also the substrate surface of the invention, permits low-cost production of metallized, non-intrinsically-conducting substrates, in particular for use as switches, sensors, and MIDs (molded interconnect devices), absorbers for electromagnetic radiation, or decorative parts, in particular decorative parts for the motor vehicle sector, sanitary sector, toy sector, household sector, and office sector, and packaging, and also foils. The invention can also be used in the sector of security printing for banknotes, credit cards, identification papers, etc. The process of the invention can be used to functionalize textiles electrically and magnetically (transmitters, RFID antennas, transponder antennas, and other antennas, sensors, heating elements, antistatic systems, including plastics, shielding systems, etc.).

Examples of these applications are cases, such as computer cases, cases for display screens, mobile telephones, audio equipment, video equipment, DVDs, and cameras, and cases for electronic components, military and non-military shielding apparatus, shower fittings and washstand fittings, shower heads, shower rails and shower holders, metallized door handles and door knobs, toilet-paper-roll holders, bathtub grips, metallized decorative strips on furniture and on mirrors, and frames for shower partitions, and packaging materials.

Mention may also be made of: metallized plastics surfaces in the automobile sector, e.g. decorative strips, exterior mirrors, radiator grilles, front-end metallization, aerofoil surfaces, exterior bodywork parts and internal parts, door sills, tread plate substitute, and decorative wheel covers.

It is also possible to produce contact sites or contact pads or wiring on an integrated electrical module.

The dispersion of the invention can likewise be used for the metallization of holes, including blind holes, of vias, etc., in printed circuit boards and RFID antennas, with the aim of establishing contact through the upper and lower side of the printed circuit board. This also applies when other substrates are used.

The metallized articles produced in the invention are moreover—as long as they comprise magnetizable metals—used in sectors involving magnetizable functional parts, e.g. magnetic panels, magnetic games, and magnetic surfaces in, for example, refrigerator doors. They are also used in sectors where good thermal conductivity is advantageous, for example in foils for seat-heating systems, floor-heating systems, and also insulation materials.

Preferred uses of the substrate surface metallized in the invention are those in which the resultant substrate serves as printed circuit board, RFID antenna, transponder antenna, seat-heating system, ribbon cable, or contactless chip cards.

EXAMPLES

Inventive Example 1

50.5 g of a spherical iron powder and 12.5 g of a lamellar copper powder were incorporated by stirring, using a dissolver stirrer, into a solution composed of 3.5 g of Vinnol® 15/40A (OH-functionalized PVC copolymer, Wacker) and 1.7 g of Desmocoll® 140 (OH-functionalized PU polymer) in 31.8 g of methyl ethyl ketone. The resultant dispersion was applied by a doctor at a layer thickness of about 4 µm to a PET foil. After drying, a copper layer of thickness about 20 µm was deposited on this metal layer, using a commercially available acidic copper sulfate bath. After storage for 5 days at room temperature, the adhesion of the deposited metal layer was determined by using a tensile tester (Zwick).

Inventive Example 2

A solution composed of 3.5 g of Vinnol® 15/40A (OH-functionalized PVC copolymer from Wacker) and 1.7 g of Desmocoll® 140 (OH-functionalized PU polymer) in 31.5 g of methyl ethyl ketone was applied by a doctor at layer thickness of about 1.5 µm to a PET foil, and dried. The dispersion from inventive example 1 was then applied to the PET foil thus primed. After drying, a copper layer of thickness of about 20 µm was deposited on this metal layer, using a commercially available acidic copper sulfate bath. After storage for 5 days at room temperature, the adhesion of the deposited metal layer was determined by using a tensile tester (Zwick).

Inventive Example 3

50.5 g of a spherical iron powder and 12.5 g of a lamellar copper powder were incorporated by stirring, using a dissolver stirrer, into a solution composed of 3 g of Vinnol® 15/48A (OH-functionalized PVC copolymer from Wacker) and 3 g of Desmocoll® 140 (OH-functionalized PU polymer) in 31 g of methyl ethyl ketone. The resultant dispersion was applied by a doctor at a layer thickness of about 4 µm to a PET foil. After drying, a copper layer of thickness about 20 µm was deposited on this metal layer, using a commercially available acidic copper sulfate bath. After storage for 5 days at room temperature, the adhesion of the deposited metal layer was determined by using a tensile tester (Zwick).

Inventive Example 4

A solution composed of 3 g of Vinnol® 15/48A (OH-functionalized PVC copolymer from Wacker) and 3 g of Desmocoll® 140 (OH-functionalized PU polymer) in 31.5 g of methyl ethyl ketone was applied by a doctor at layer thickness of about 1.5 µm to a PET foil, and dried. The dispersion from inventive example 3 was then applied to the PET foil thus primed. After drying, a copper layer of thickness about 20 µm was deposited on this metal layer, using a commercially available acidic copper sulfate bath. After storage for 5 days at room temperature, the adhesion of the deposited metal layer was determined by using a tensile tester (Zwick).

Inventive Example 5

A solution composed of 3.5 g of Vinnol® 15/40A (OH-functionalized PVC copolymer from Wacker) and 1.7 g of Desmocoll® 140 (OH-functionalized PU polymer) in 31.5 g of methyl ethyl ketone was applied by a doctor at layer thickness of about 1.5 µm to a PET foil, and dried.

The following dispersion was then applied to the PET foil thus primed:

50.5 g of a spherical iron powder and 12.5 g of a lamellar copper powder are incorporated by stirring, using a dissolver stirrer, into a solution composed of 3 g of Vinnol® 15/40A (OH-functionalized PVC copolymer, Wacker) and 3 g of Desmocoll® 140 (OH-functionalized PU polymer) in 31 g of methyl ethyl ketone. The resultant dispersion was applied by a doctor at a layer thickness of about 4 µm to a PET foil. After drying, a copper layer of thickness about 20 µm was deposited on this metal layer, using a commercially available acidic copper sulfate bath. After storage for 5 days at room temperature, the adhesion of the deposited metal layer was determined by using a tensile tester (Zwick).

Inventive Example 6

A solution composed of 3.5 g of Vinnol®15/40A (OH-functionalized PVC copolymer from Wacker) and 1.7 g of Desmocoll® 140 (OH-functionalized PU polymer) in 31.5 g of methyl ethyl ketone was applied by a doctor at layer thickness of about 1.5 µm to a PET foil, and dried.

The following dispersion was then applied to the PET foil thus primed:

50.5 g of a spherical iron powder and 12.5 g of a lamellar copper powder are incorporated by stirring, using a dissolver stirrer, into a solution composed of 1.7 g of Vinnol® 15/40A (OH-functionalized PVC copolymer, Wacker) and 3.5 g of Desmocoll® 140 (OH-functionalized PU polymer) in 31.5 g of methyl ethyl ketone. The resultant dispersion was applied by a doctor at a layer thickness of about 4 µm to a PET foil.

After drying, a copper layer of thickness about 20 µm was deposited on this metal layer, using a commercially available acidic copper sulfate bath. After storage for 5 days at room temperature, the adhesion of the deposited metal layer was determined by using a tensile tester (Zwick).

Comparative Example 1

Example 1 of DE-A-102005043242 was Repeated Exactly 8.4 g of an ethylene-vinyl acetate copolymer were dissolved in 126 g of n-butyl acetate 378 g of spherical iron powder and 42.0 g of a lamellar copper powder were dispersed in this solution with the aid of a dissolver stirrer. The resultant dispersion was applied at a thickness of 4 µm to a primed PET foil. After drying, a copper layer of thickness 9 µm was applied in an acidic copper sulfate bath.

Comparative Example 2

Example 2 of DE-A-102005043242 was Repeated Exactly 8.4 g of an ethylene-vinyl acetate copolymer were dissolved in 96.6 g of n-butyl acetate. 378 g of spherical iron powder and 42.0 g of a lamellar copper powder were dispersed in this solution with the aid of a dissolver stirrer. The resultant dispersion was applied at a thickness of 4 µm to a primed PET foil. After drying, a copper layer of thickness 9 µm was applied in an acidic copper sulfate bath.

The results obtained are stated in the table below.

TABLE

|  | Example 1 | Example 2 | Example 3 | Example 4 |
|---|---|---|---|---|
| Copper adhesion N/mm | 0.15 | 0.28 | 0.14 | 0.22 |
|  | Example 5 | Example 6 | Comp. Ex. 1 | Comp. Ex. 2 |
| Copper adhesion N/mm | 0.26 | 0.25 | 0.07 | <0.05 |

The invention claimed is:

1. A dispersion for the application of a metal layer on a non-electrically-conductive substrate, comprising
an organic binder component A,
a metal component B, and
a solvent component C,
wherein the organic binder component A consists essentially of
A1 a polyvinyl chloride copolymer having hydroxy groups and
A2 a polyurethane having hydroxy groups, and
wherein the oxidation state of the metal is 0, wherein the surface of the metal can have a coating, and wherein the metal component B comprises
B1 from 0.01 to 99.99% by weight, based on the total weight of metal component B, of a first metal with a first metal particle shape, and
B2 from 99.99 to 0.01% by weight, based on the total weight of metal component B, of a second metal with a second metal particle shape;
where there is compliance with at least one of the following conditions:
(1) the first and second metal are different
(2) the first and second particle shape are different.

2. The dispersion according to claim 1, wherein component A1 is obtained by polymerization of vinyl chloride with allyl alcohol and/or with a hydroxyacrylate and/or with an allyl ester of a hydroxycarboxylic acid or by polymerization of vinyl chloride and vinyl acetate, wherein the resultant polymer can be further hydrolyzed to form repeating vinyl alcohol units, and wherein A2 is a linear polyurethane containing hydroxy groups.

3. The dispersion according to claim 1, wherein components A1 and A2 make up at least 80% by weight of binder component A and wherein for each part by weight of A2 there are from about 0.25 to 4 parts by weight, in particular from 1 to 2 parts by weight, of component A1.

4. The dispersion according to claim 1, which comprises:
from 0.01 to 30% by weight of the organic binder component A,
from 30 to 89.99% by weight of the metal component B, and
from 10 to 69.99% by weight of the solvent component C, based in each case on the total weight of the dispersion.

5. The dispersion according to claim 1, which comprises at least one of the following components:
D from 0.01 to 50% by weight, based on the total weight of the dispersion, of a dispersing agent component; and also
E from 0.01 to 50% by weight, based on the total weight of the dispersion, of a filler component based on carbon.

6. The dispersion according to claim 1, wherein metal component B has been selected in a mutually independent manner from the group consisting of zinc, nickel, copper, tin, cobalt, manganese, iron, magnesium, lead, chromium, bismuth, silver, gold, aluminum, titanium, palladium, platinum, tantalum, and alloys thereof.

7. The dispersion according to claim 1, wherein the average particle diameter of the metal of metal component B is in the range from 0.001 to 100 µm.

8. A process for the production of a dispersion according to claim 1 by
mixing of components A to C and of further components, and
dispersion of the mixture.

9. A process for the production of a metal layer on at least one portion of the surface of a non-electrically-conductive substrate by
a) application to the substrate of a dispersion according to claim 1;
b) drying of the applied layer on the substrate; and
c) optionally, deposition of a metal by a currentless and/or electroplating method on the dried dispersion layer.

10. The process according to claim 9, wherein a primer is first applied to the substrate, prior to application of the dispersion and wherein the binder component of the primer comprises components A1+A2, and wherein the substrate is a PET, PVC, PEN, PC or PA foil and wherein the dispersion is applied on the substrate by a printing process in which the dispersion undergoes a change of volume and/or of position with the aid of an energy-dissipating device, which dissipates energy in the form of electromagnetic waves, and the dispersion is thus transferred to the substrate.

11. A coated substrate with a surface obtainable obtained according to claim 9.